United States Patent
Toratani et al.

(10) Patent No.: US 8,784,568 B2
(45) Date of Patent: Jul. 22, 2014

(54) METHOD OF CLEANING SEMICONDUCTOR MANUFACTURING APPARATUS, SEMICONDUCTOR MANUFACTURING APPARATUS, AND MANAGEMENT SYSTEM

(75) Inventors: Kenichiro Toratani, Yokohama (JP); Takashi Nakao, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 549 days.

(21) Appl. No.: 13/051,804

(22) Filed: Mar. 18, 2011

(65) Prior Publication Data
US 2011/0232686 A1    Sep. 29, 2011

(30) Foreign Application Priority Data

Mar. 24, 2010 (JP) ................... 2010-67773
Mar. 3, 2011 (JP) ................... 2011-46387

(51) Int. Cl.
B08B 5/04 (2006.01)
(52) U.S. Cl.
USPC ........... 134/21; 134/18; 134/22.1; 134/22.18; 134/26; 134/30; 134/34; 134/36
(58) Field of Classification Search
None
See application file for complete search history.

(56) References Cited

U.S. PATENT DOCUMENTS

| 6,211,081 | B1 | 4/2001 | Mikata |
| 6,383,897 | B2 | 5/2002 | Mikata |
| 2005/0016687 | A1* | 1/2005 | Shinriki et al. ......... 156/345.52 |

FOREIGN PATENT DOCUMENTS

| JP | 7-94488 | 4/1995 |
| JP | 2004-6620 | 1/2004 |
| JP | 2007-194361 | 8/2007 |
| JP | 2009-33121 | 2/2009 |
| JP | 2009-123795 | 6/2009 |
| JP | 2009-124050 | 6/2009 |

OTHER PUBLICATIONS

JPO machine translation of JP 07094488 retrieved from JPO on Oct. 9, 2013.*
Notification of Reason for Rejection issued by the Japanese Patent Office on May 25, 2012, for Japanese Patent Application No. 2011-046387, and English-language translation thereof.
Notification of Reasons for Rejection issued by the Japanese Patent Office on Mar. 9, 2012, for Japanese Patent Application No. 2011-046387, and English-language translation thereof.

* cited by examiner

*Primary Examiner* — Eric Golightly
(74) *Attorney, Agent, or Firm* — Finnegan, Henderson, Farabow, Garrett & Dunner, L.L.P.

(57) ABSTRACT

In one embodiment, a method of cleaning a semiconductor manufacturing apparatus includes supplying a cleaning gas for removing a deposition film deposited on an inside wall of a treatment chamber through a supply pipe of the treatment chamber so that a supply amount of the cleaning gas from the supply pipe per unit time is greater than an exhaust amount of the cleaning gas from an exhaust pipe of the treatment chamber per unit time. The method further includes supplying an inert gas to fill the supply pipe with the inert gas.

12 Claims, 12 Drawing Sheets

METHOD OF CLEANING SEMICONDUCTOR MANUFACTURING APPARATUS, SEMICONDUCTOR MANUFACTURING APPARATUS, AND MANAGEMENT SYSTEM

CROSS REFERENCE TO RELATED APPLICATIONS

This application is based upon and claims the benefit of priority from the prior Japanese Patent Applications No. 2010-67773, filed on Mar. 24, 2010, and 2011-46387, filed on Mar. 3, 2011, the entire contents of which are incorporated herein by reference.

FIELD

Embodiments described herein relate to a method of cleaning a semiconductor manufacturing apparatus, a semiconductor manufacturing apparatus, and a management system.

BACKGROUND

As a conventional technique, there is known a method of manufacturing a semiconductor device, including a step of supplying a first gas containing a halogen gas and a second gas containing an oxygen gas into a treatment chamber and keeping the first and second gases in the chamber, and a step of vacuumizing the chamber to exhaust the first and second gases. The method performs these steps as one cycle, and repeats such cycle a plurality of times (for example, refer to JP-A 2009-124050 (KOKAI)).

According to this method, it is possible to remove a deposition film (such as a high-k film) deposited on the inside surface of the treatment chamber.

Recently, it has been required to reduce the amount of using the first gas to remove such deposition film.

DETAILED DESCRIPTION

Embodiments will now be explained with reference to the accompanying drawings.

An embodiment described herein is a method of cleaning a semiconductor manufacturing apparatus. The method includes supplying a cleaning gas for removing a deposition film deposited on an inside wall of a treatment chamber through a supply pipe of the treatment chamber so that a supply amount of the cleaning gas from the supply pipe per unit time is greater than an exhaust amount of the cleaning gas from an exhaust pipe of the treatment chamber per unit time. The method further includes supplying an inert gas to fill the supply pipe with the inert gas.

Another embodiment described herein is a semiconductor manufacturing apparatus. The apparatus includes a cleaning gas supply unit configured to supply a cleaning gas for removing a deposition film deposited on an inside wall of a treatment chamber through a supply pipe of the treatment chamber so that a supply amount of the cleaning gas from the supply pipe per unit time is greater than an exhaust amount of the cleaning gas from an exhaust pipe of the treatment chamber per unit time. The apparatus further includes an inert gas supply unit configured to supply an inert gas to fill the supply pipe with the inert gas.

Another embodiment described herein is a management system including a plurality of semiconductor manufacturing apparatuses. Each of the plurality of semiconductor manufacturing apparatuses includes a cleaning gas supply unit configured to supply a cleaning gas for removing a deposition film deposited on an inside wall of a treatment chamber through a supply pipe of the treatment chamber so that a supply amount of the cleaning gas from the supply pipe per unit time is greater than an exhaust amount of the cleaning gas from an exhaust pipe of the treatment chamber per unit time, and an inert gas supply unit configured to supply an inert gas to fill the supply pipe with the inert gas. The system further includes a control unit configured to control the cleaning gas supply units and the inert gas supply units of the plurality of semiconductor manufacturing apparatuses.

(1) First Embodiment (Structure of Semiconductor Manufacturing Apparatus)

Figure 1A:
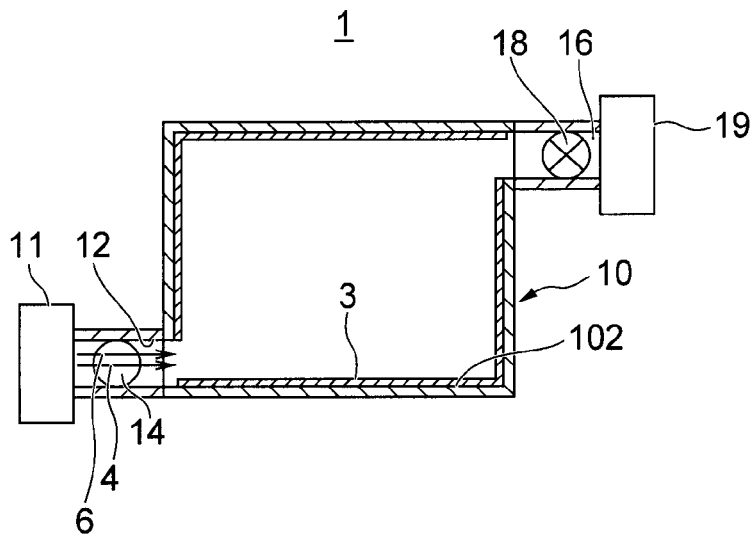
FIGS. 1A to 1C are schematic cross-sectional views illustrating a treatment chamber of a semiconductor manufacturing apparatus according to a first embodiment.
Figure 1B:
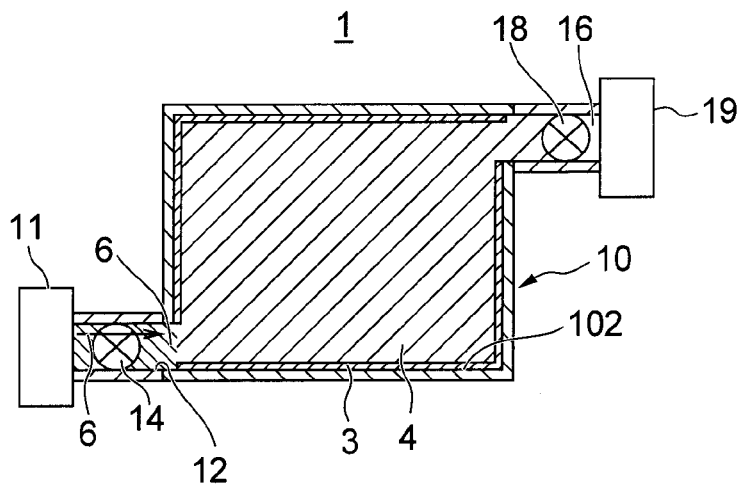
Figure 1C:
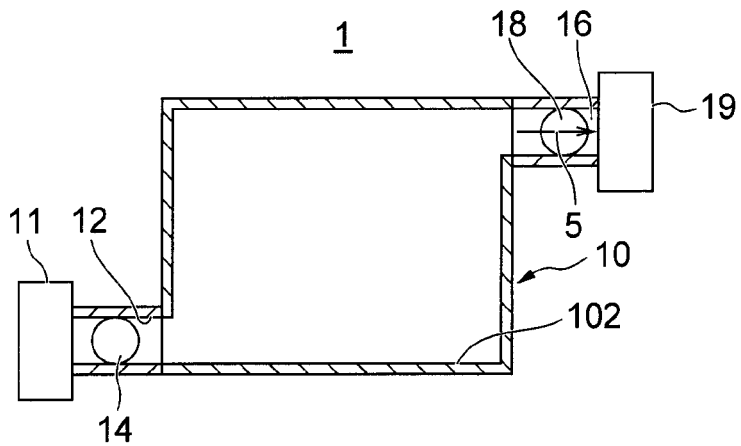

FIGS. 1A to 1C are schematic cross-sectional views illustrating a treatment chamber of a semiconductor manufacturing apparatus according to a first embodiment. The semiconductor manufacturing apparatus 1 is, for example, a deposition apparatus for forming a thin film on a semiconductor substrate. An example of the deposition apparatus includes a chemical vapor deposition (CVD) apparatus.

As shown in FIG. 1A, the semiconductor manufacturing apparatus 1 includes, for example, a treatment chamber 10, a supply unit 11, a supply pipe 12, a supply valve 14, an exhaust pipe 16, an exhaust valve 18, and an exhaust unit 19.

The treatment chamber 10 is made of, for example, $SiO_2$ (quartz).

In the semiconductor manufacturing apparatus 1, if a process of forming a thin film on a semiconductor substrate is repeatedly performed many times, a deposition film 3 is formed on the inside wall 102 of the treatment chamber 10. The deposition film 3 mainly contains the same material as that of the thin film.

The deposition film 3 is, for example, a film containing silicon atoms, such as a silicon film, a silicon oxide film, or a silicon nitride film, but it may be different depending on the film formed in the treatment chamber 10. In addition, the deposition film 3 may be a metal oxide film such as alumina ($Al_2O_3$).

The supply pipe 12 and the exhaust pipe 16 are connected to the treatment chamber 10, for example. The supply pipe 12 and the exhaust pipe 16 may be integrated with the treatment chamber 10 to form a single body together.

The supply pipe 12 is provided with the supply valve 14. The supply valve 14 is configured to transmit and block the flow of the gas supplied from the supply unit 11 to the inner side of the treatment chamber 10.

The supply unit 11 is configured to supply desired gases such as a cleaning gas 4 or an inert gas 6 into the treatment chamber 10. The supply unit 11 is an example of a cleaning gas supply unit and an inert gas supply unit of the disclosure.

For example, a gas containing a halogen gas is used as the cleaning gas 4. In the present embodiment, since the deposition film 3 is the film containing silicon atoms, a gas containing a fluorine gas is used as the cleaning gas 4, for example. The cleaning gas 4 is, for example, a mixed gas containing a halogen gas and a diluent gas such as a rare gas or a nitrogen ($N_2$) gas. The exhaust pipe 16 is provided with an exhaust valve 18.

The exhaust valve 18 is configured to transmit and block the flow of the gas from the treatment chamber 10. For example, an exhaust unit 19 is connected to the exhaust pipe 16.

The exhaust unit 19 is configured to vacuumize the treatment chamber 10, for example, by exhausting the gas in the treatment chamber 10 through the exhaust pipe 16.

Hereinafter, an exemplary method of cleaning the semiconductor manufacturing apparatus according to an embodiment will be described.

(Method of Cleaning Semiconductor Manufacturing Apparatus)

Figure 2:
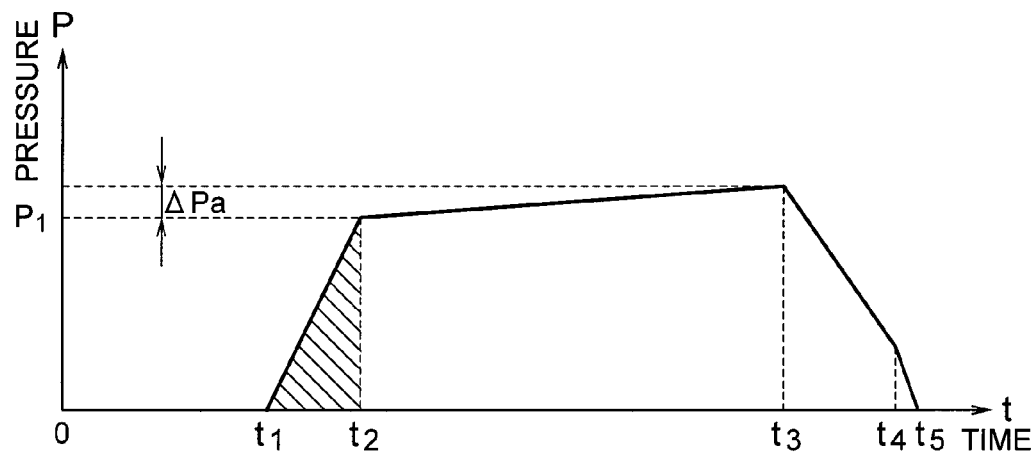
FIG. 2 is a graph illustrating a relationship between time t and pressure P in the treatment chamber according to the first embodiment.
Figure 3:
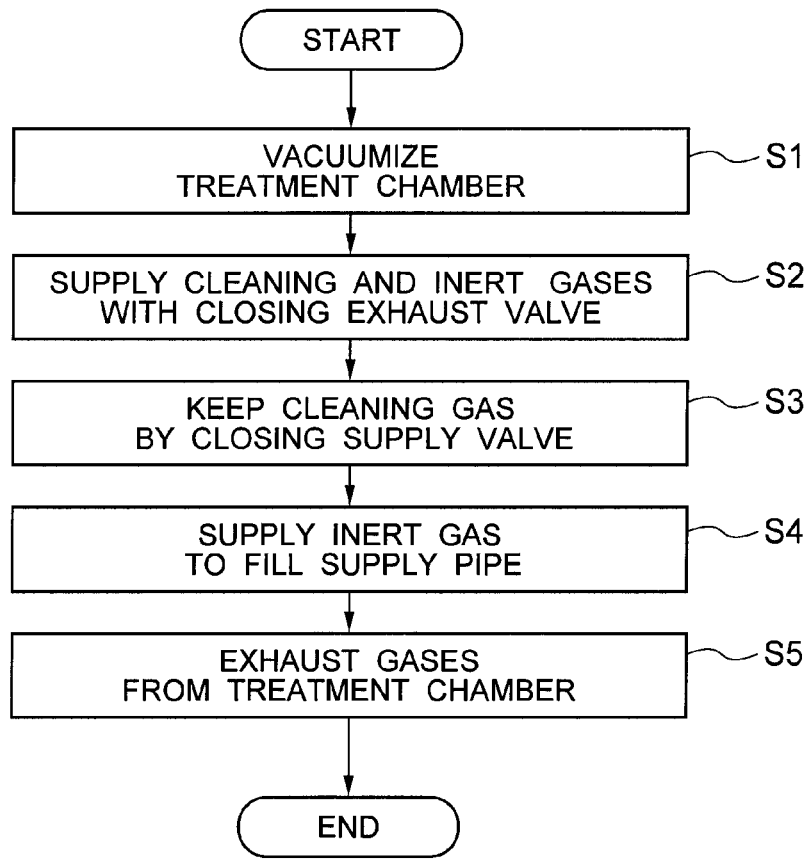
FIG. 3 is a flowchart illustrating a cleaning method using an inert gas according to the first embodiment.

FIG. 2 is a graph illustrating a relationship between time t and pressure P in the treatment chamber according to the first embodiment. FIG. 3 is a flowchart illustrating a cleaning method using an inert gas according to the first embodiment. Description will now be made for a case where a $Si_3N_4$ film as the deposition film 3 is deposited onto the inside wall 102 of the treatment chamber 10 to a thickness of 100 nm.

First, while the supply valve 14 is closed and the exhaust valve 18 is opened, the treatment chamber is vacuumized using the exhaust unit 19 (Step S1, vacuum process). In FIG. 2, the time $t_1$ of FIG. 2 represents the time for initiating supply of the cleaning gas 4 after the treatment chamber 10 is vacuumized.

Then, as shown in FIG. 1A, while the supply valve 14 is opened and the exhaust valve 18 is closed or slightly opened, the cleaning gas 4 and the inert gas 6 outputted from the supply unit 11 are supplied to the treatment chamber 10 up to a predetermined pressure $P_1$ (refer to FIG. 2) (Step S2).

Specifically, the cleaning gas 4 of a $F_2$/HF gas is supplied at a flow rate of 2 slm (standard liter/min). In addition, the cleaning gas 4 and the inert gas 6 are supplied to the treatment chamber 10 up to a predetermined pressure, for example, 200 torr. The cleaning gas 4 and the inert gas 6 are supplied for a time period from $t_1$ to $t_2$ as indicated by the hatched line in FIG. 2 (however, while the supply of the cleaning gas 4 is terminated at time $t_2$, the supply of the inert gas 6 still continues until time $t_3$). The supply of the inert gas 6 may be further continues after time $t_3$ to generate a gas flow while exhausting the gases from the chamber 10. FIG. 2 shows a situation where the supply of the inert gas 6 continues until $t_4$.

In Step S2, the cleaning gas 4 is supplied so that a supply amount of the cleaning gas 4 from the supply pipe 12 per unit time is greater than an exhaust amount of the cleaning gas 4 from the exhaust pipe 16 per unit time. Therefore, the amount of the cleaning gas 4 in the treatment chamber 10 increases with time. In a case where the cleaning gas 4 is supplied while the exhaust valve 18 is closed, the exhaust amount is zero. Therefore, the supply amount becomes greater than the exhaust amount in this case. On the other hand, in a case where the cleaning gas 4 is supplied while the exhaust valve 18 is slightly opened, it is required to adjust the supplying and the exhausting of the cleaning gas 4 so that the supply amount becomes greater than the exhaust amount. More preferably, the exhaust amount is set negligibly small compared with the supply amount (i.e., exhaust amount<<supply amount).

Next, after the treatment chamber 10 is pressurized to a predetermined pressure $P_1$, the cleaning gas 4 is kept in the treatment chamber 10 by closing or slight opening of the supply valve 14 (Step S3). The time period from $t_2$ to $t_3$, that is, the period between stopping of the supply of the cleaning gas 4 and initiating of the evacuation is set to, for example, one minute. In a case where Step S2 is performed by slightly opening the exhaust valve 18, the exhaust valve 18 is closed in Step S3.

Next, as shown in FIG. 1B, the inert gas 6 is supplied from the supply unit 11 to fill the supply pipe 12 with the inert gas 6 so that the cleaning gas 4 cannot stay in the supply pipe 12 (Step S4). The supply of the inert gas 6 using the supply unit 11 is performed, for example, while the supply valve 14 is slightly opened. In the meantime, the exhaust valve 18 is kept in a closed state.

Examples of the inert gas 6 include a helium (He) gas, a neon (Ne) gas, and an argon (Ar) gas, when the semiconductor manufacturing apparatus 1 is a plasma CVD apparatus. Also, an example of the inert gas 6 includes a nitrogen ($N_2$) gas, when the semiconductor manufacturing apparatus 1 is a low pressure (LP) CVD apparatus. In the present embodiment, the Ar or $N_2$ gas is used as the inert gas 6. The pressure difference $\Delta P_a$ shown in FIG. 2 is a change in pressure of the treatment chamber 10 that increases when the Ar or $N_2$ gas is supplied. In addition, the inert gas 6 may be, for example, clean dry air (CDA).

The cleaning gas 4 etches the deposition film 3 deposited onto the inside wall 102 of the treatment chamber 10. The amount of the cleaning gas 4 supplied to the treatment chamber 10 or the keeping time ($t_2$ to $t_3$) of the cleaning gas 4 is set, for example, based on the type or the thickness of the deposition film 3, the etching rate of the deposition film 3 by the cleaning gas 4 or the like. Such setting also may be determined such that the etching selectivity between the deposition film 3 and the inside wall 102 of the treatment chamber 10 becomes large to suppress the etching of the inside wall 102 by the cleaning gas 4. An example of the cleaning gas 4 is such a gas that contains a nitrogen trifluoride ($NF_3$) gas, when the semiconductor manufacturing apparatus 1 is the plasma CVD apparatus. Also, an example of the cleaning gas 4 is such a gas that contains a fluorine ($F_2$) gas and a hydrogen fluoride (HF) gas, when the semiconductor manufacturing apparatus 1 is the low pressure CVD apparatus.

Next, as shown in FIG. 1C, after a predetermined time period passes, the gases in the treatment chamber 10 are evacuated using the exhaust unit 19 by opening the exhaust valve 18 (Step S5), and the cleaning of the treatment chamber 10 is finished. During the time period from $t_3$ to $t_5$ shown in FIG. 2, the gases are evacuated to vacuumize the treatment chamber 10. At the evacuation time $t_5$, the gases in the treatment chamber 10 are perfectly evacuated, and the treatment chamber 10 is vacuumized again. In addition, while Step S5 is performed, the supply valve 14 may be in a closed state or a slightly open state.

In addition, the time period to perform the steps S2 to S5 (i.e., the cleaning time period from $t_1$ to $t_5$) is set, for example, to one and a half minutes.

Hereinafter, an exemplary method of manufacturing a semiconductor device using a method of cleaning a semiconductor manufacturing apparatus according to an embodiment will be described.

(Method of Manufacturing Semiconductor Device)

First, a semiconductor substrate containing silicon as a main component is prepared, and a silicon oxide film $SiO_2$ is formed on the semiconductor substrate by thermal oxidation or the like.

Then, the deposition film 3 inside the treatment chamber 10 is removed using the above method of cleaning the semiconductor manufacturing apparatus, and a silicon nitride film ($Si_3N_4$) is formed on the silicon oxide film by CVD using the semiconductor manufacturing apparatus 1.

Next, the silicon nitride film is patterned into a desired shape by photolithography and reactive ion etching (RIE) or the like. Then, a desired semiconductor device is obtained through processes known in the art.

Here, in the process of forming the silicon nitride film, if the deposition film 3 thicker than a predetermined thickness is deposited inside the treatment chamber 10, the above method of cleaning the semiconductor manufacturing apparatus is performed, and therefore the deposition film 3 inside treatment chamber 10 is removed.

(Effects of First Embodiment)

In the method of cleaning the semiconductor manufacturing apparatus according to the present embodiment, it may be possible to reduce the use amount of the cleaning gas 4. Comparing between a case where the cleaning is performed by keeping the cleaning gas 4 in the treatment chamber 10 and a case where the cleaning is carried in a state in which the cleaning gas 4 is not kept in the treatment chamber 10, for example, under a condition that the cleaning time and the use amount of the cleaning gas 4 are the same in both cases, the deposition film 3 can be etched more significantly in the case where the cleaning gas 4 is kept. In the above cleaning method, it may be possible to remove a thick deposition film 3 even at a low pressure of the cleaning gas 4 by keeping the cleaning gas 4. Since the use amount of the cleaning gas 4 is small, it is possible to reduce costs for manufacturing the semiconductor device. Experiments by the inventors and the like show that the use amount of the cleaning gas 4 can be reduced up to about 1/10 in comparison with the cleaning performed without keeping the cleaning gas 4 in the treatment chamber 10.

In the method of the related art in which the cleaning gas is kept in the treatment chamber, it is probable that the inside wall of the supply pipe may be etched, onto which the deposition film is not nearly formed, or formed to thickness smaller than that of the deposition film inside the treatment chamber. However, in the method of cleaning the semiconductor manufacturing apparatus according to the present embodiment, since the supply pipe 12 is filled with the inert gas 6, the inside wall of the supply pipe 12 is not etched.

Furthermore, in the method of cleaning a semiconductor manufacturing apparatus according to the present embodiment, compared to the cleaning method in which the cleaning gases continuously flow instead of being kept in the treatment chamber, it is possible to reduce the use amount of the cleaning gas 4, improve the throughput, and reduce a turn-around time (TAT) for manufacturing the semiconductor device.

In addition, in the method of cleaning the semiconductor manufacturing apparatus according to the present embodiment, it is possible to manufacture the semiconductor device, keeping the deposition film 3 from being deposited on the inside wall 102 of the treatment chamber 10. Therefore, it is possible to prevent contamination of the semiconductor substrate caused by the deposition film 3 peeled off the inside wall 102 of the treatment chamber 10, and as a result it is possible to improve a product yield.

(2) Second Embodiment

The second embodiment differs from the first embodiment in that the frequency of the cleaning increases depending on the thickness of the deposition film without changing a period T of cleaning time. Hereafter, when describing the following respective embodiments, identical reference numerals denote identical or similar elements as in the first embodiment, and therefore description of these elements will not be abbreviated.

Figure 4A:
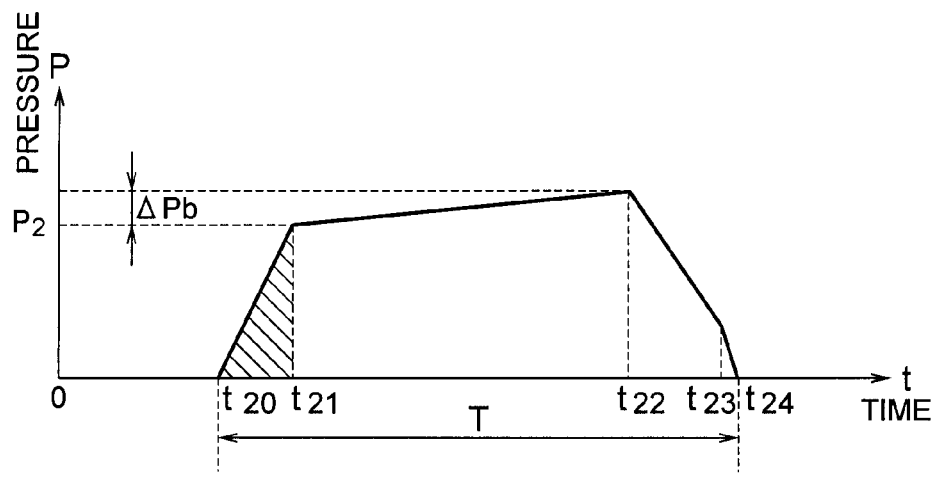
FIG. 4A is a graph illustrating a relationship between time t and pressure P in the treatment chamber when a cleaning gas is supplied into the treatment chamber once.
Figure 4B:
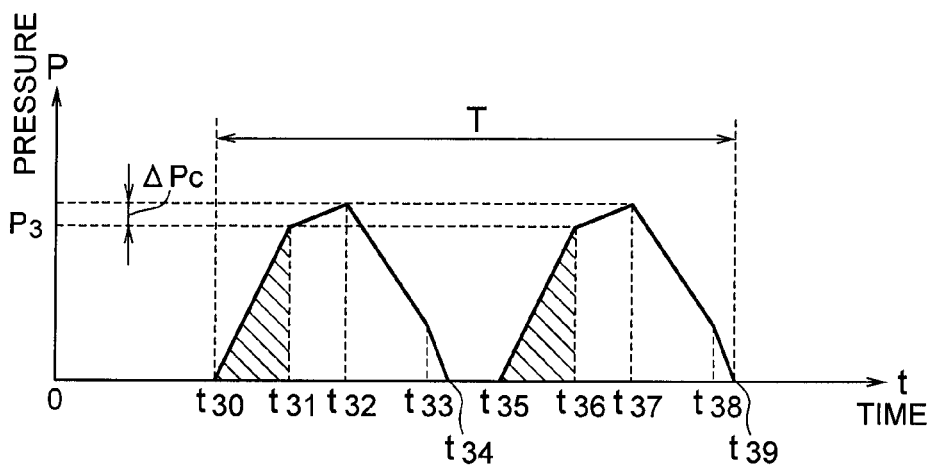
FIG. 4B is a graph illustrating a case where the cleaning is performed twice within the same cleaning time period as that of FIG. 4A.
Figure 5:
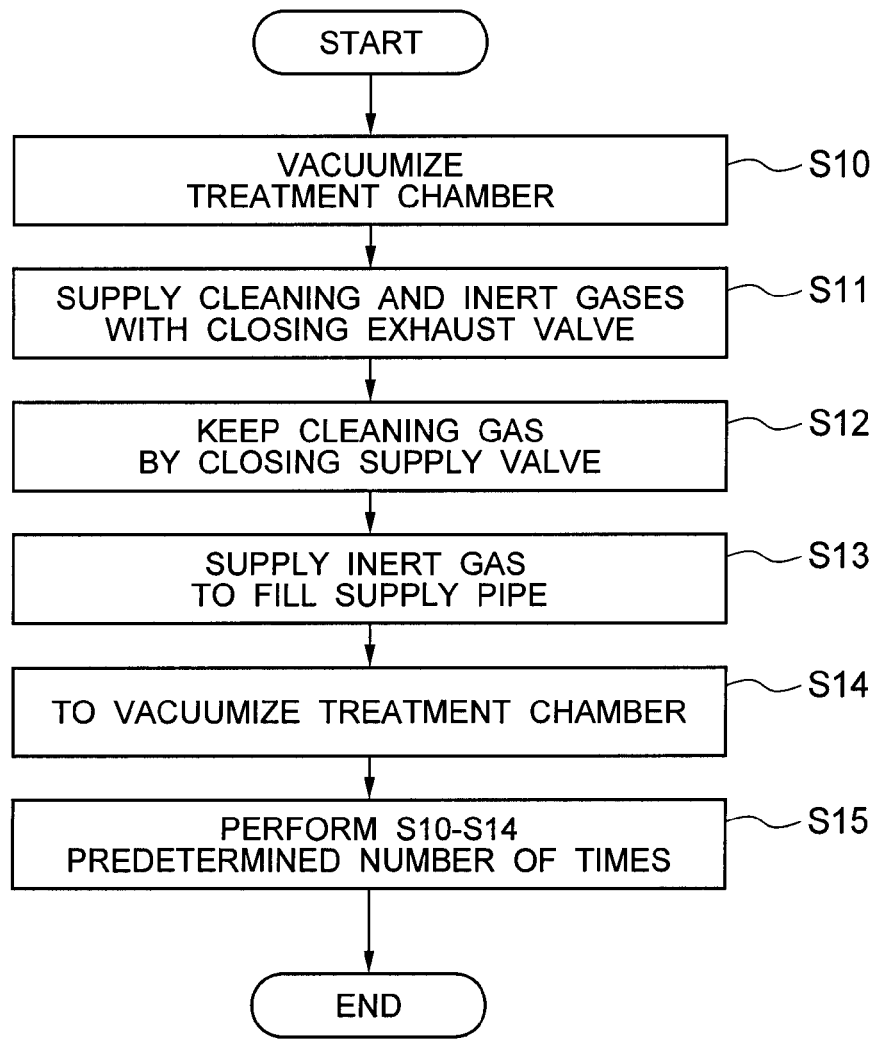
FIG. 5 is a flowchart illustrating a case where the cleaning is performed a plurality of times according to a second embodiment.

FIG. 4A is a graph illustrating a relationship between time t and pressure P in the treatment chamber when the cleaning gas is supplied into the treatment chamber once. FIG. 4B is a graph illustrating a case where the cleaning is performed twice within the same cleaning time period as that of FIG. 4A. FIG. 5 is a flowchart illustrating a case where the cleaning is performed a plurality of times according to the second embodiment. Description will now be made for a case where a $Si_3N_4$ film as the deposition film 3 deposits onto the inside wall 102 of the treatment chamber 10 to a thickness of 5000 nm. The cleaning time period (T) from $t_{20}$ to $t_{24}$ represents the cleaning time (a predetermined cleaning time period) to remove the deposition film 3 by one time of a cleaning operation at a pressure $P_2$ in the treatment chamber 10. The reference symbol $\Delta P_b$ shown in FIG. 4A denotes a change in pressure of the treatment chamber 10 that increases when the Ar or $N_2$ gas is supplied. The reference symbol $\Delta P_c$ shown in FIG. 4B denotes a change in pressure of the treatment chamber 10 that increases when the Ar or $N_2$ gas is supplied. The pressure $P_3$ and the pressure difference $\Delta P_c$ are set to the same values for first and second cleanings as shown in FIG. 4B, but they may be not be limited thereto. The pressure $P_3$ and the pressure difference $\Delta P_c$ may be set to different values.

Steps S10 to S14 are performed by setting the pressure in the treatment chamber 10 to the same value $P_3$ as in Steps 1 to 5 of the first embodiment. However, the time period from $t_{30}$ to $t_{34}$ in the second embodiment is reduced in comparison with the time period from $t_1$ to $t_5$ of the first embodiment.

Next, Steps S10 to S14 are repeated a predetermined number of times (Step S15) so that the cleaning of the semiconductor manufacturing apparatus 1 is finished. In the present embodiment, Steps S10 to S14 are repeated twice as a predetermined frequency during the time period from $t_{35}$ to $t_{39}$.

Specifically, the semiconductor manufacturing apparatus 1 obtains, in advance, setup values such as an optimal keeping time of the cleaning gas 4, an optimal gas amount of the kept cleaning gas 4, and an optimal keeping frequency through experiments or simulations, and performs the cleaning in the treatment chamber 10 based on the setup values depending on the measured thickness of the deposition film 3. The setup values may be obtained from an external device.

(Effects of Second Embodiment)

In the method of cleaning the semiconductor manufacturing apparatus according to the present embodiment, even when the thickness of the deposition film 3 is large, it is possible to remove the deposition film 3 by repeating the cleaning process several times without changing the cleaning time period or the TAT. In addition, in the above cleaning method, compared to the case where the cleaning process is not repeated, it is also possible to reduce the cleaning time period by increasing the use amount of the cleaning gas 4.

(3) Third Embodiment

A third embodiment is different from each of the above embodiments in that the inert gas 6 is not supplied to the supply pipe 12. This cleaning method is effective, for example, when the supply pipe 12 is formed of a material which is not etched by the cleaning gas 4, i.e., a material exhibiting etching resistance to the cleaning gas 4.

When the cleaning gas 4 contains at least one of $F_2$, HF, and $NF_3$, examples of the material which is not etched by the cleaning gas 4 include aluminum and alumina. In this case, the entire supply pipe 12 may be formed of aluminum or alumina, or only the inside wall of the supply pipe 12 may be formed of aluminum or alumina.

Figure 6A:
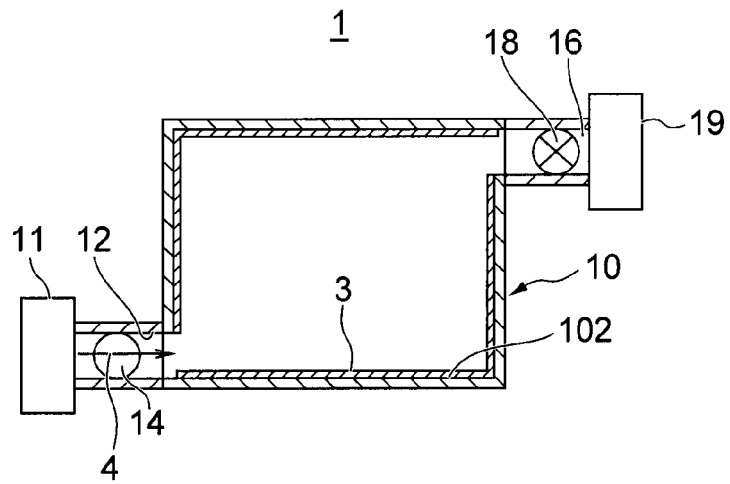
FIGS. 6A to 6C are schematic cross-sectional views illustrating a treatment chamber of a semiconductor manufacturing apparatus according to a third embodiment.
Figure 6B:
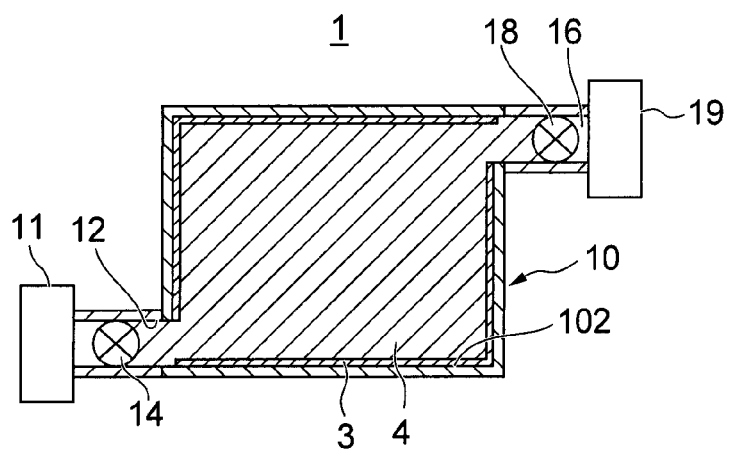
Figure 6C:
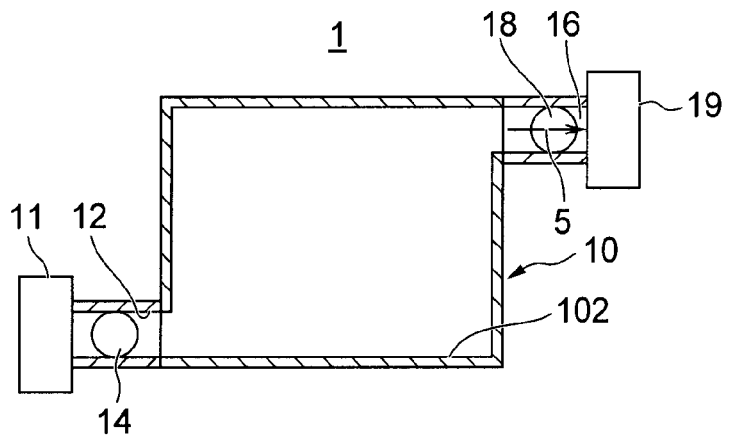
Figure 7:
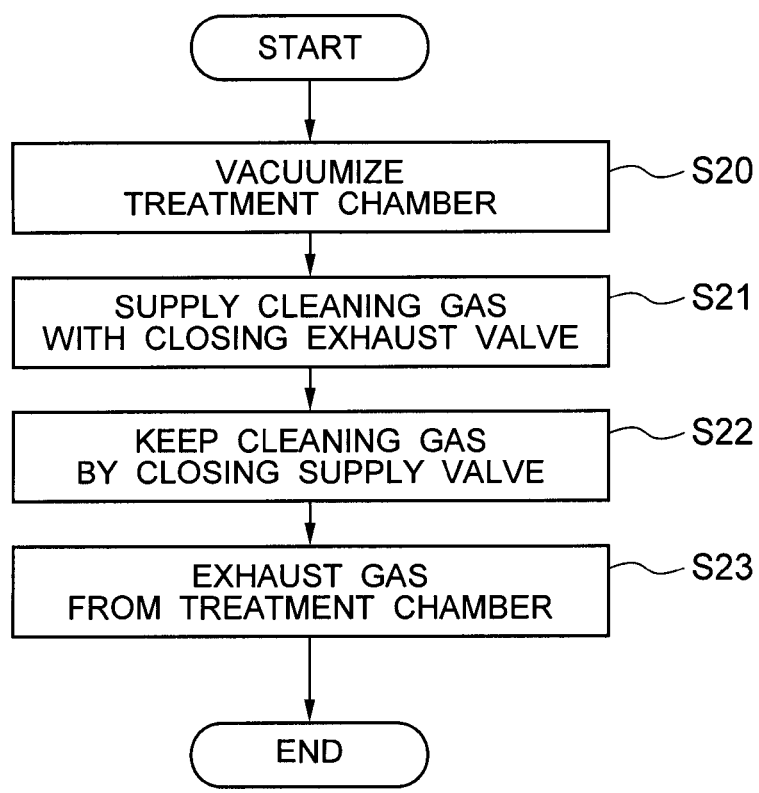
FIG. 7 is a flowchart illustrating a case where the inert gas is not used according to the third embodiment.

FIGS. 6A to 6C are schematic cross-sectional views illustrating the treatment chamber of the semiconductor manufacturing apparatus according to the third embodiment. FIG. 7 is a flowchart illustrating a case where the inert gas is not used according to the third embodiment. First, a supply valve 14 is closed, an exhaust valve 18 is opened, and a treatment chamber 10 is vacuumized using an exhaust unit 19 (Step S20). Then, as shown in FIG. 6A, the supply valve 14 is opened, the exhaust valve 18 is closed, and the cleaning gas 4 is supplied to the treatment chamber 10 through the supply pipe 12 using a supply unit 11 (Step S21).

Next, after the pressure in the treatment chamber 10 reaches a predetermined value, the supply valve 14 is closed to keep the cleaning gas 4 in the treatment chamber 10 as shown in FIG. 6B (Step S22).

Next, after a predetermined time period passes thereafter, as shown in FIG. 6C, the exhaust valve 18 is opened, and the gas in the treatment chamber 10 is exhausted (Step S23), so that the cleaning of the semiconductor manufacturing apparatus 1 is finished.

(Effects of Third Embodiment)

In the method of cleaning the semiconductor manufacturing apparatus according to the present embodiment, compared to the case where the inert gas 6 is supplied to the supply pipe 12, it is possible to reduce costs for manufacturing the semiconductor device.

(4) Fourth Embodiment

A fourth embodiment is different from each of the above embodiments in that the cleaning is repeated without supplying the inert gas 6 to the supply pipe 12. Such a cleaning method is effective, for example, when the supply pipe 12 is formed of a material which is not etched by the cleaning gas 4.

Figure 8:
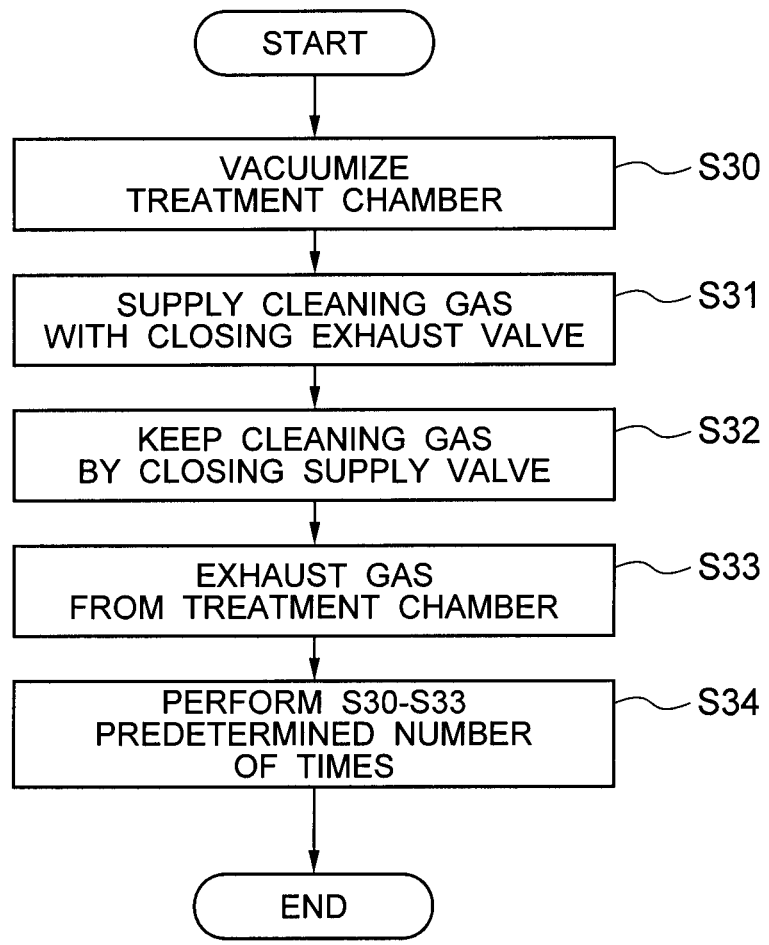
FIG. 8 is a flowchart illustrating a case where the cleaning is repeated without using the inert gas according to a fourth embodiment.

FIG. 8 is a flowchart illustrating a case where the cleaning is repeated without using the inert gas according to the fourth embodiment. Steps S30 to S33 in FIG. 8 are similar to Steps S20 to S23 of the third embodiment.

Next, Steps S30 to S33 are repeated predetermined times (Step S34), and then the cleaning of the semiconductor manufacturing apparatus 1 is finished.

(Effects of Fourth Embodiment)

In the method of cleaning the semiconductor manufacturing apparatus according to this embodiment, even when the thickness of the deposition film 3 is large, it is possible to remove the deposition film 3 by performing the cleaning several times without changing or reducing the cleaning time period or the TAT.

(5) Fifth Embodiment

Figure 9:
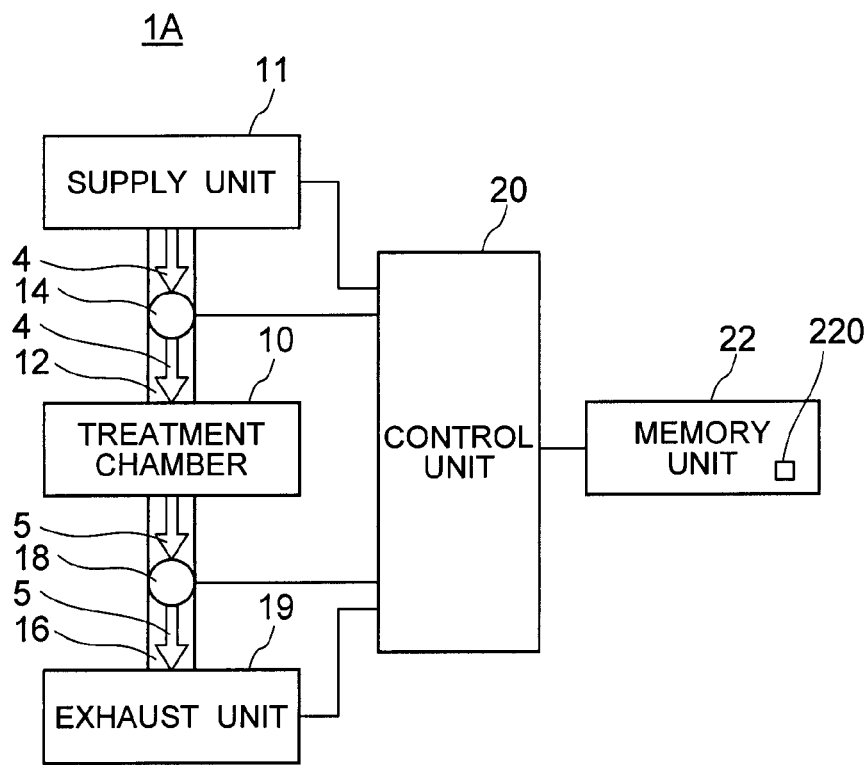
FIG. 9 is a block diagram illustrating a semiconductor manufacturing apparatus according to a fifth embodiment.

FIG. 9 is a block diagram illustrating a semiconductor manufacturing apparatus according to a fifth embodiment. FIG. 9 illustrates a case where a cleaning gas 4 is supplied by opening a supply valve 14 and an exhaust valve 18 to illustrate the flow of the cleaning gas 4 and an exhaust gas 5.

Referring to FIG. 9, the semiconductor manufacturing apparatus 1A includes, for example, a treatment chamber 10, a supply unit 11, a supply pipe 12, a supply valve 14, an exhaust pipe 16, an exhaust valve 18, an exhaust unit 19, a control unit 20, and a memory unit 22. In addition, the semiconductor manufacturing apparatus 1A is configured to perform the method of cleaning the semiconductor manufacturing apparatus according to the first to fourth embodiments by executing a program 220.

The control unit 20 is, for example, a microcomputer including a central processing unit (CPU) or the like, and controls the supply unit 11, the supply valve 14, the exhaust valve 18, the exhaust unit 19, and the like based on the program 220 stored in the memory unit 22.

The memory unit 22 is, for example, a storage device such as a hard disk drive (HDD), a semiconductor memory, or the like. The program 220 stored in the memory unit 22 contains, for example, instructions for executing each process in any one of the cleaning methods of the semiconductor manufacturing apparatus according to the first to fourth embodiments.

The control unit 20 selects, from the program 220, any one of the cleaning methods of the semiconductor manufacturing apparatus according to the first to fourth embodiments, for example, depending on the type or the thickness of the deposition film 3, the processing status of the semiconductor manufacturing apparatus 1A, or the like, which have been obtained and/or set. The processing status refers to, for example, a vacant processing time of the semiconductor manufacturing apparatus 1A, the number of remaining processing targets, or the like.

In addition, the program 220 may be stored in the memory unit 22. Alternatively, the program 220 may be read from an external device or via networks and then executed. Furthermore, the program 220 may be configured to execute processes of the first to fourth embodiments, or each embodiment may be stored in the memory unit 22 as a different program.

Hereinafter, operations of the semiconductor manufacturing apparatus according to the fifth embodiment will be described by exemplifying the method of cleaning the semiconductor manufacturing apparatus according to the first embodiment.

(Method of Cleaning Semiconductor Manufacturing Apparatus)

Description will be made by assuming that a $Si_3N_4$ film as the deposition film 3 deposits onto the inside wall 102 of the treatment chamber 10 to a thickness of 100 nm.

First, the control unit 20 reads the program 220 from the memory unit 22.

The control unit 20 closes the supply valve 14 based on the reading of the program 220. Subsequently, the control unit 20 controls the exhaust unit 19 to vacuumize the treatment chamber 10.

While the supply valve 14 is opened, and the exhaust valve 18 is closed, the control unit 20 controls the supply unit 11 to supply the cleaning gas 4 to the treatment chamber 10 up to a predetermined pressure.

After the treatment chamber 10 is filled with the cleaning gas 4 at a predetermined pressure, the control unit 20 closes the supply valve 14 to keep the cleaning gas 4 in the treatment chamber 10.

Then, the control unit 20 controls the supply unit 11 to supply the inert gas 6 so as to fill the supply pipe 12 with the inert gas 6 so that the cleaning gas 4 may not stay in the supply pipe 12.

After a predetermined time period passes thereafter, the control unit 20 opens the exhaust valve 18 and evacuates the gas in the treatment chamber 10 using the exhaust unit 19 so that the cleaning of the treatment chamber 10 is finished.

(Effects of Fifth Embodiment)

In the semiconductor manufacturing apparatus 1A according to the present embodiment, at least one of the cleaning methods of the semiconductor manufacturing apparatus according to the first to fourth embodiments may be performed. The semiconductor manufacturing apparatus 1A can select the cleaning methods according to the first to fourth embodiments based on the type or the thickness of the deposition film 3, the processing status of the semiconductor manufacturing apparatus 1A, or the like, which have been obtained and/or set. Therefore, in comparison with the case where selection of the cleaning method is not allowed, it is possible to effectively perform the cleaning of the treatment chamber 10.

(6) Sixth Embodiment

Figure 10:
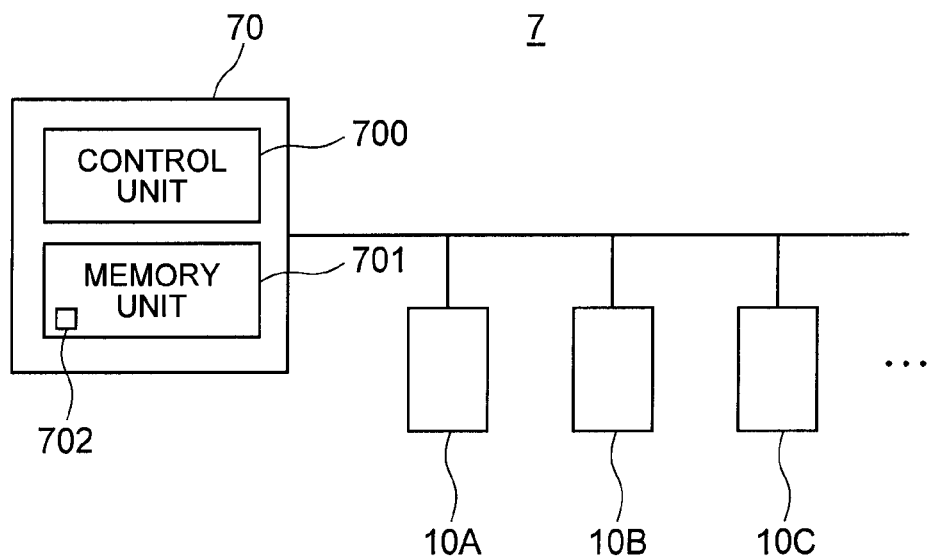
FIG. 10 is a block diagram illustrating a management system according to a sixth embodiment.

FIG. 10 is a block diagram illustrating a management system according to a sixth embodiment. The management system 7 includes, for example, a plurality of semiconductor manufacturing apparatuses 10A to 10C according to the fifth embodiment, and a control unit 700 for controlling exhaust valves 18 and supply units 11 of the plurality of the semiconductor manufacturing apparatuses 10A to 10C.

The control unit 700 is provided, for example, in a management apparatus 70, and the semiconductor manufacturing apparatuses 10A to 10C are connected to the management apparatus 70. In addition, the semiconductor manufacturing apparatus may be single.

The semiconductor manufacturing apparatuses 10A to 10C may be configured, for example, without at least the program 220 in the semiconductor manufacturing apparatus 1A of the fifth embodiment. In addition, for example, surface areas, volumes, materials, or the like may be different between the treatment chambers of the semiconductor manufacturing apparatuses 10A to 10C. Furthermore, for example, the type or the thickness of the film to be formed, or the like may be different between the semiconductor manufacturing apparatuses 10A to 10C.

The management apparatus 70 is provided with, for example, a memory unit 701. The control unit 700 of the management apparatus 70 is, for example, a microcomputer including a central processing unit (CPU) or the like, and reads and executes the program 702 stored in the memory unit 701.

The program 702 has the same function, for example, as that of the program 220 of the fifth embodiment. In addition, the control unit 700 selects the cleaning method, the type of the cleaning gas 4, the optimal keeping time, the optimal keeping pressure, and the optimal keeping frequency shown in the first to fourth embodiments according to the program 702, for example, based on information such as the processing status or the configurations of the semiconductor manufacturing apparatuses 10A to 10C, the type or the thickness of the deposition film 3 deposited inside the treatment chamber 10 obtained and/or set from the semiconductor manufacturing apparatuses 10A to 10C.

In addition, the control unit 700 is configured to output, for example, process data, parameters, or the like of the selected cleaning method to the targeted semiconductor manufacturing apparatus. In addition, the management apparatus 70 may be configured to perform the cleaning, for example, based on the number of semiconductor wafers to be manufactured by individual semiconductor manufacturing apparatuses.

(Effects of Sixth Embodiment)

In the management system 7 according to the present embodiment, it is possible to remove the deposition film deposited inside the treatment chambers of a plurality of the semiconductor manufacturing apparatuses, reducing the use amount of the cleaning gas 4. Since the use amounts of cleaning gases 4 in each of a plurality of semiconductor manufacturing apparatuses 10A to 10C can be reduced using the management system 7, it is possible to suppress the manufacturing cost of the semiconductor device.

In the management system 7 according to the present embodiment, it is possible to perform the cleaning while the processing status of a plurality of semiconductor manufacturing apparatuses is managed. Therefore, it is possible to effectively perform the cleaning. With this management system 7, it is possible to select the way of cleaning among the cleaning performed with the reduced amount of the cleaning gas 4, the cleaning performed with the fixed TAT, the cleaning performed with the reduced TAT, and the like.

(7) Seventh Embodiment

Figure 11:
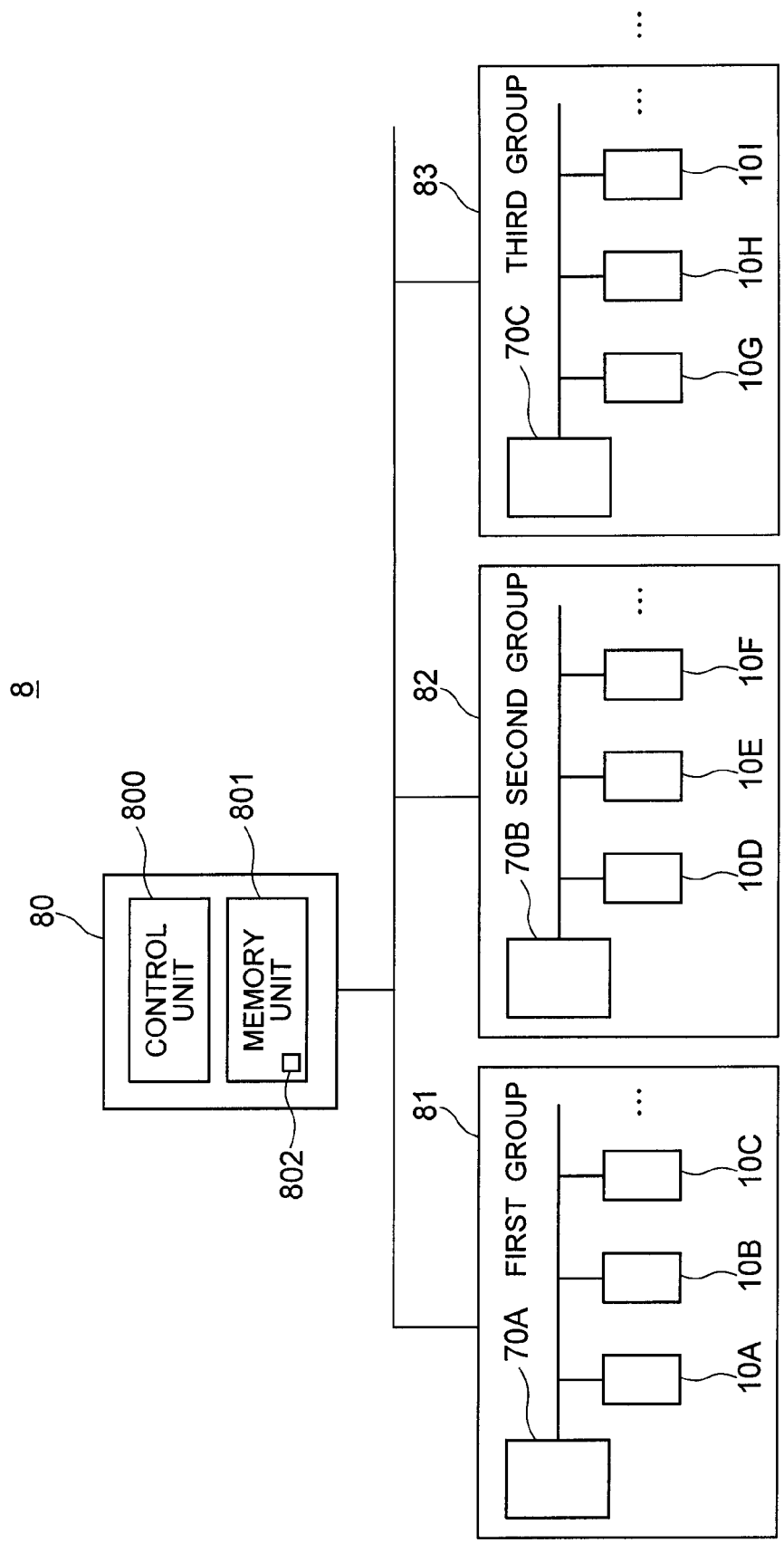
FIG. 11 is a block diagram illustrating a management system according to a seventh embodiment.

FIG. 11 is a block diagram illustrating a management system according to a seventh embodiment. A management system 8 according to the present embodiment includes, for example, a total management apparatus 80 and first to third groups 81 to 83 managed by the total management apparatus 80 as shown in FIG. 11. The number of groups is not limited to the above number.

The first group 81 includes, for example, a management apparatus 70A and semiconductor manufacturing apparatuses 10A to 10C managed by the management apparatus 70A. The second group 82 includes, for example, a management apparatus 70B and semiconductor manufacturing apparatuses 10D to 10F managed by the management apparatus 70B. The third group 83 includes, for example, a management apparatus 70C and semiconductor manufacturing apparatuses 10G to 10I managed by the management apparatus 70C. In addition, the number of semiconductor manufacturing apparatuses managed by each group is not limited to the above number.

The management apparatuses 70A to 70C are configured, for example, at least not to include the program 702 in the management apparatus 70 of the sixth embodiment.

For example, surface areas, volumes, and materials of each treatment chamber, the type and the thickness of the film to be formed, or the like may be different, between the semiconductor manufacturing apparatuses 10A to 10I belonging to the first to third groups 81 to 83.

The total management apparatus 80 generally includes, for example, a control unit 800 and a memory unit 801. The control unit 800 is, for example, a microcomputer including a central processing unit (CPU) or the like, and reads and executes the program 802 stored in the memory unit 801.

The program 802 has the same function, for example, as that of the program 702 of the sixth embodiment. The control unit 800 selects the cleaning method, the type of the cleaning gas 4, the optimal keeping time, the optimal keeping pressure, and the optimal keeping frequency shown in the first to fourth embodiments according to the program 802, for example, based on information such as the processing status or the configurations of the semiconductor manufacturing apparatuses 10A to 10I, the type or the thickness of the deposition film 3 deposited inside the treatment chamber 10 obtained from the management apparatuses 70A to 70C of the first to third groups of 81 to 83.

In addition, the control unit 800 is configured to output, for example, process data, parameters, or the like of the selected cleaning method to the management apparatus of the group belonging to the targeted semiconductor manufacturing apparatus. In addition, the total management apparatus 80 may be configured to perform the cleaning, for example, based on the number of semiconductor wafers manufactured by individual semiconductor manufacturing apparatuses.

(Effects of Seventh Embodiment)

In the management system 8 according to the present embodiment, it is possible to remove the deposition film deposited inside the treatment chambers of a plurality of the semiconductor manufacturing apparatuses, reducing the use amount of the cleaning gas 4. Since the use amounts of cleaning gases 4 in each of a plurality of semiconductor manufacturing apparatuses 10A to 10C can be reduced using the management system 8, it is possible to suppress the manufacturing cost of the semiconductor device.

(8) Eighth Embodiment

Figure 12A:
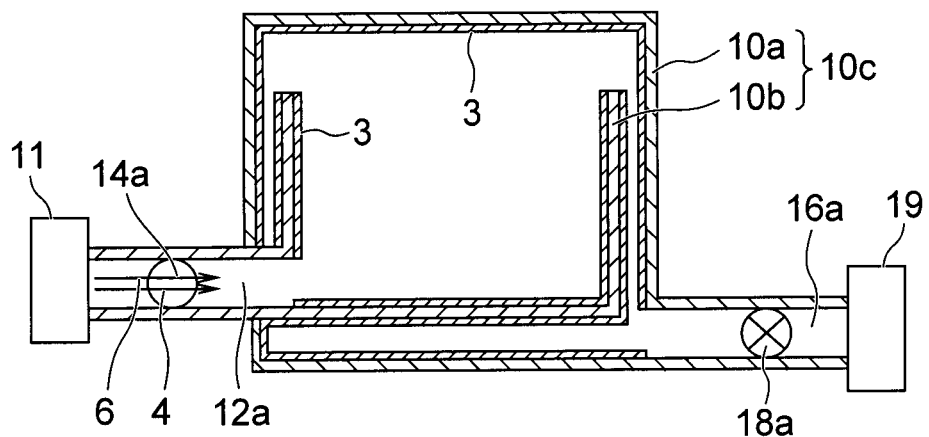
FIG. 12A is a schematic cross-sectional view illustrating a treatment chamber of a semiconductor manufacturing apparatus according to an eighth embodiment.
Figure 12B:
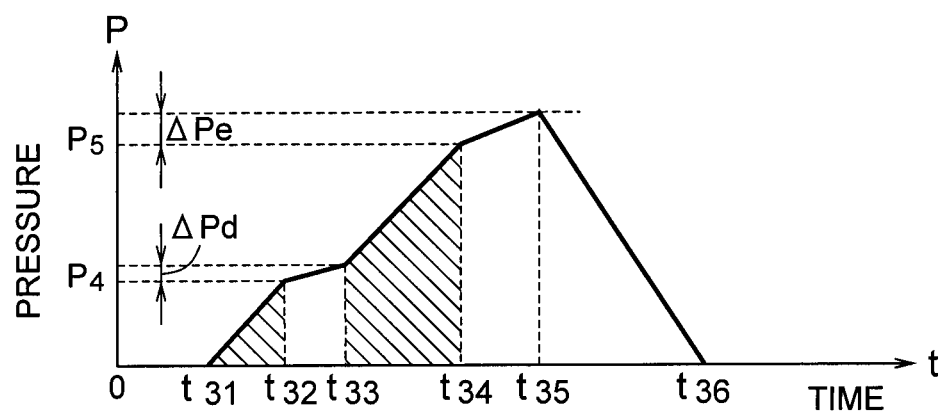
FIG. 12B is a graph illustrating a relationship between time t and pressure P in the treatment chamber of FIG. 12A.

FIG. 12A is a schematic cross-sectional view illustrating a treatment chamber of a semiconductor manufacturing apparatus according to an eighth embodiment. FIG. 12B is a graph illustrating a relationship between time t and pressure P in the treatment chamber of FIG. 12A. The pressure difference $\Delta P_d$ shown in FIG. 12B is a change in pressure of the treatment chamber 10 which increases by a first supply of an Ar or $N_2$ gas. The pressure difference $\Delta P_e$ shown in FIG. 12B is a change in a pressure inside the treatment chamber 10 which increases by a second supply of the Ar or $N_2$ gas.

The semiconductor manufacturing apparatus is includes, for example, a treatment chamber 10c having an outer pipe 10a and an inner pipe 10b provided inside the outer pipe 10a, a supply unit 11, and an exhaust unit 19, as shown in FIG. 12A.

The outer pipe 10a includes, for example, an exhaust pipe 16a and an exhaust valve 18a provided in the exhaust pipe 16a.

The inner pipe 10b includes, for example, a supply pipe 12a and a supply valve 14a provided in the supply pipe 12a.

A deposition film 3 is deposited onto the inside wall of the treatment chamber 10c depending on the type of the formed film as shown in FIG. 12A. In the portion surrounded by the outer pipe 10a and the inner pipe 10b, a path of a cleaning gas 4 is clogged with the deposition film 3.

(Method of Cleaning Semiconductor Manufacturing Apparatus)

Figure 13:
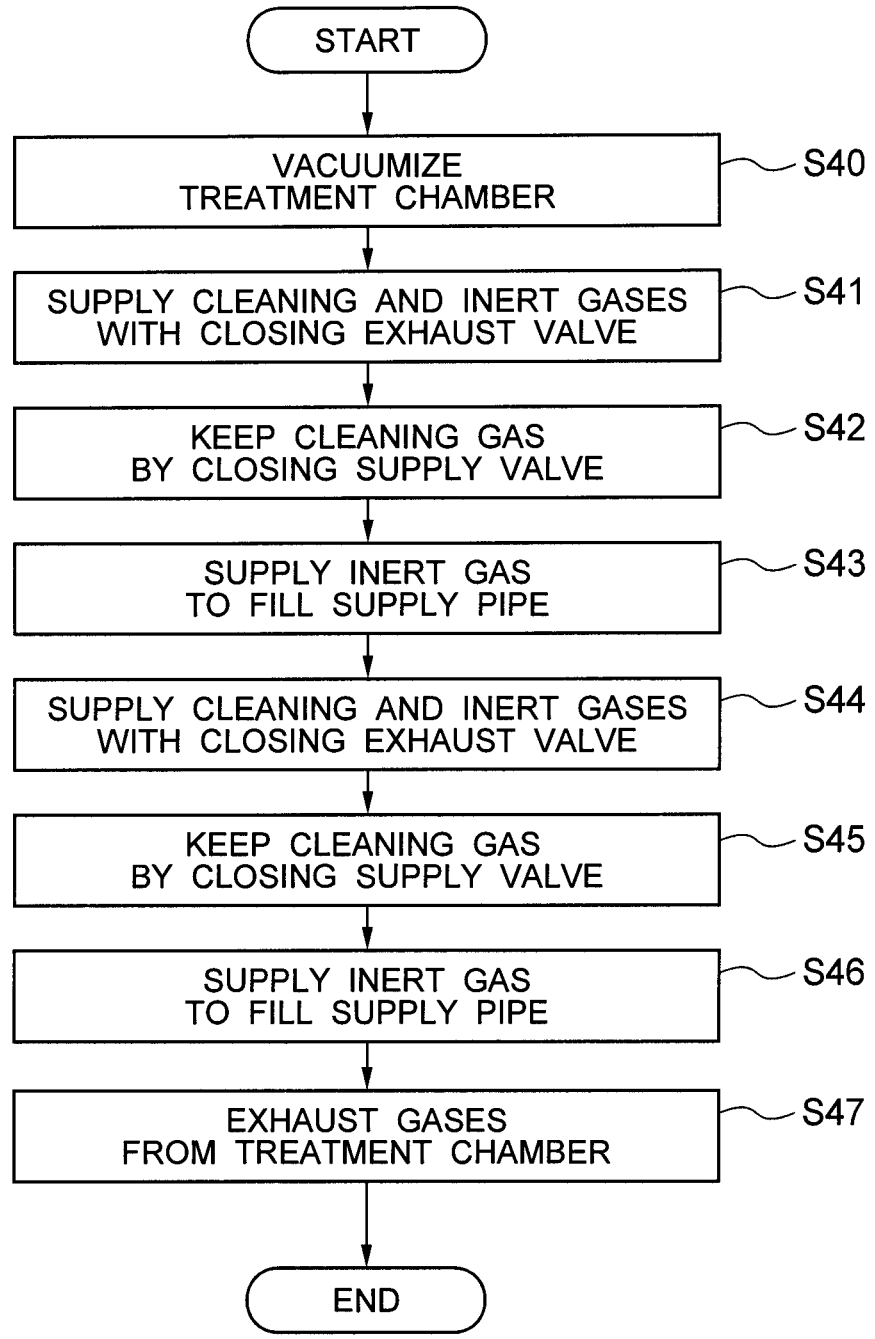
FIG. 13 is a flowchart illustrating a method of cleaning the semiconductor manufacturing apparatus according to the eighth embodiment.

FIG. 13 is a flowchart illustrating a method of cleaning the semiconductor manufacturing apparatus according to the eighth embodiment.

First, while the supply valve 14a is closed and the exhaust valve 18a is opened, the treatment chamber 10c is vacuumized by the exhaust unit 19 (Step S40). The time $t_{31}$ of FIG. 12B refers to a time when the supply of the cleaning gas 4 is initiated after the treatment chamber 10c is vacuumed.

Next, while the supply valve 14a is opened and the exhaust valve 18a is closed, the cleaning gas 4 and the inert gas 6 are supplied from the supply unit 11 to the treatment chamber 10c until the pressure inside the treatment chamber 10 reaches a pressure $P_4$ (refer to FIG. 12B) (Step S41). The supply of the cleaning gas 4 and the inert gas 6 is performed during the time period from $t_{31}$ to $t_{32}$ as indicated by the hatched lines in FIG. 12B (however, while the supply of the cleaning gas 4 is terminated at the time $t_{32}$, the supply of the inert gas 6 still continues until a time $t_{35}$). The supply of the inert gas 6 may be further continues after time $t_{35}$ to generate a gas flow while exhausting the gases from the chamber 10c.

In Step S41, the cleaning gas 4 is supplied so that the supply amount of the cleaning gas 4 from the supply pipe 12a per unit time is greater than the exhaust amount of the cleaning gas 4 from the exhaust pipe 16a per unit time. Therefore, the amount of the cleaning gas 4 in the treatment chamber 10c increases with time.

Next, after the inner side of the treatment chamber 10 is pressurized to the predetermined pressure $P_4$, the supply valve 14a is closed, and the cleaning gas 4 is kept in the treatment chamber 10 for the time period from $t_{32}$ to $t_{33}$ (Step S42).

During the time period from $t_{32}$ to $t_{33}$, the inert gas 6 is supplied from the supply unit 11 to fill the supply pipe 12a with the inert gas 6 so that the cleaning gas 4 may not stay in the supply pipe 12a (Step S43). In this case, the pressure inside the treatment chamber 10 increases from the pressure $P_4$ by a pressure difference $\Delta P_d$ as shown in FIG. 12B.

Next, by opening the supply valve 14a, the cleaning gas 4 and the inert gas 6 are supplied from the supply unit 11 to the treatment chamber 10c up to a pressure $P_5$ (refer to FIG. 12B) (Step S44). The supply of the cleaning gas 4 is performed for the time period from $t_{33}$ to $t_{34}$ as indicated by the hatched lines in FIG. 12B (however, while the supply of the cleaning gas 4 is terminated at the time $t_{34}$, the supply of the inert gas 6 still continues until the time $t_{35}$).

In Step S44, the cleaning gas 4 is supplied so that the supply amount of the cleaning gas 4 from the supply pipe 12a per unit time is greater than the exhaust amount of the cleaning gas 4 from the exhaust pipe 16a per unit time. Therefore, the amount of the cleaning gas 4 in the treatment chamber 10c increases with time.

Next, after the inner side of the treatment chamber 10 is pressurized to the predetermined pressure $P_5$, the supply valve 14a is closed, and the cleaning gas 4 is kept in the treatment chamber 10 for the time period from $t_{34}$ to $t_{35}$ (Step S45).

For the time period from $t_{34}$ to $t_{35}$, the inert gas 6 is supplied from the supply unit 11 to fill the supply pipe 12a with the inert gas 6 so that the cleaning gas 4 may not stay in the supply pipe 12a (Step S46). In this case, the pressure in the treatment chamber 12 increases from the pressure $P_5$ by a pressure difference $\Delta P_e$ as shown in FIG. 12B.

Next, after a predetermined time period passes thereafter, by opening the exhaust valve 18a, the gases are evacuated from the treatment chamber 10 using the exhaust unit 19 (Step S47), and the cleaning of the treatment chamber 10c is finished.

(Effects of Eighth Embodiment)

In the cleaning method performed by the semiconductor manufacturing apparatus of the present embodiment, the supply of the cleaning gas 4 is performed plural times to keep the cleaning gas 4. According to the present embodiment, resistance generated when the cleaning gas 4 is kept is increased, compared with a cleaning method in which the supply of the cleaning gas 4 is performed a single time to kept the cleaning gas 4 under the condition that the amount of the cleaning gas 4 and the pressure P when the cleaning gas 4 is kept are the same as the present embodiment (for example, $P=P_5$). Therefore, in the present embodiment, an amount of the cleaning gas 4 filling a narrow space interposed between the outer pipe 10a and the inner pipe 10b becomes sufficient, so that the cleaning can be made easy. In the cleaning of the treatment chamber 10c including the outer pipe 10a and the inner pipe 10b, the space between the outer pipe 10a and the inner pipe 10b may be clogged, and the deposition film 3 may not be sufficiently etched. However, in the semiconductor manufacturing apparatus of the present embodiment, the cleaning gas 4 is kept in the treatment chamber 10c in a way that the cleaning gas 4 is supplied a plurality of times without performing the vacuumizing. Therefore, it is possible to remove the deposition film 3 in the narrow space interposed between the outer pipe 10a and the inner pipe 10b.

In the above semiconductor manufacturing apparatus, compared to a cleaning method in which vacuumizing is performed, and the cleaning is repeated, it is possible to reduce the cleaning time.

While the vacuumizing is not performed and the cleaning gas 4 is kept in two steps in the present embodiment, the step number may not be limited thereto. That is, the cleaning gas 4 may be kept in more steps.

The disclosure is not limited to the above embodiments, and these embodiments may be modified or combined in various ways without departing from spirit or scope of the disclosure.

While the deposition film 3 is a SiN film in each of the above embodiments, it may not be limited thereto. The deposition film 3 may be, for example, a polysilicon film or a $SiO_2$ film. When the deposition film 3 is a polysilicon film, a gas containing a chlorine trifluoride ($ClF_3$) gas is used as the cleaning gas 4, for example. When the deposition film 3 is a $SiO_2$ film, a gas containing a fluorine ($F_2$) gas, a hydrogen fluoride (HF) gas, or a nitrogen trifluoride ($NF_3$) gas, or a mixed gas containing two or more of those three gases is used as the cleaning gas 4, for example.

In addition, while the supply pipe 12 is made of $SiO_2$ in each of the above embodiments, it may not be limited thereto. The supply pipe 12 may be made of alumina or stainless steel or the like. When the supply pipe 12 is etched by the cleaning gas 4, for example, the cleaning methods described in the first and second embodiments are used. When the supply pipe 12 is not etched by the cleaning gas 4, for example, the cleaning methods described in the third and fourth embodiments are used.

While the supply pipe 12 is filled with the inert gas 6 in the first, second, and eighth embodiments, the exhaust pipe 16 may be also filled with the inert gas 6.

Figure 14:
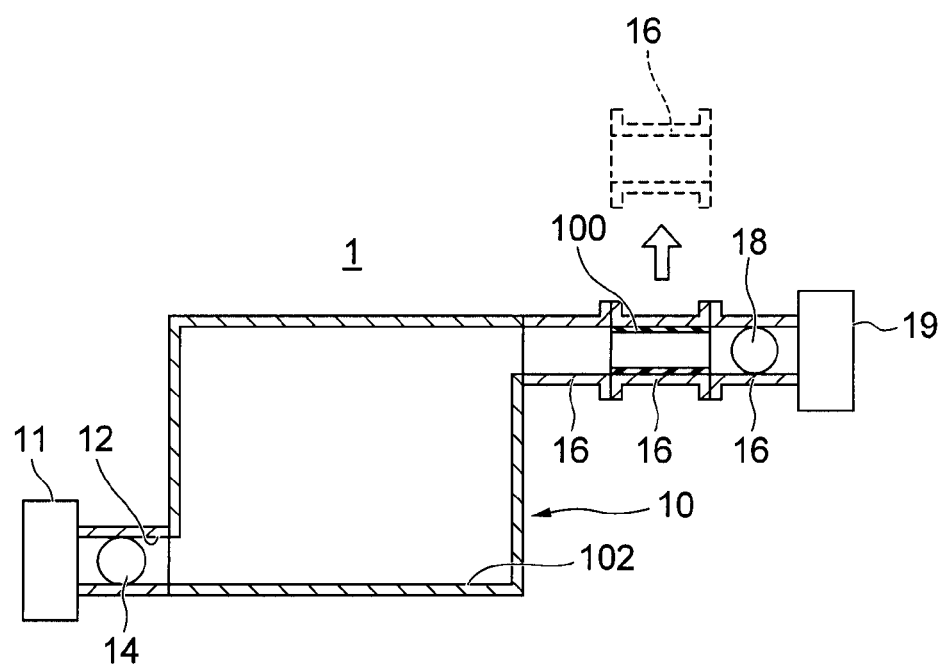
FIG. 14 is a schematic cross-sectional view illustrating a treatment chamber of a semiconductor manufacturing apparatus according to a modification of the first to eighth embodiments.

On the other hand, when the exhaust pipe 16 is not filled with the inert gas 6, the surface of the inside wall of the exhaust pipe 16 may be coated by a protection film that can be etched by the cleaning gas 4. However, the protection film is formed of a material that does not contaminate the thin film formed on the semiconductor substrate even if the protection film is etched out. Such protection film can prevent the main body part of the exhaust pipe 16 from being etched and also prevent the protection film from serving as contaminants after being etched. In this case, the exhaust pipe 16 may be configured to be detachable from the treatment chamber 10 (see FIG. 14), and the protection film may be applied to the exhaust pipe 16 again as the protection film is removed. Alternatively, the exhaust pipe 16 may be replaced with another exhaust pipe 16. FIG. 14 is a schematic cross-sectional view illustrating a treatment chamber of a semiconductor manufacturing apparatus according to a modification of the first to eighth embodiments. FIG. 14 shows the protection film 100 coated on the surface of the inside wall of the detachable exhaust pipe 16. In a case where a gas containing at least one of $F_2$, HF, and $NF_3$ is used as the cleaning gas 4, an example of the protection film include an $SiO_2$ film such as a quartz film.

Also, when the exhaust pipe 16 is not filled with the inert gas 6, the exhaust pipe 16 may be formed of a material which is not etched by the cleaning gas 4, i.e., a material exhibiting etching resistance to the cleaning gas 4. When the cleaning gas 4 contains at least one of $F_2$, HF, and $NF_3$, examples of the material which is not etched by the cleaning gas 4 include aluminum and alumina. In this case, the entire exhaust pipe 16 may be formed of aluminum or alumina, or only the inside wall of the exhaust pipe 16 may be formed of aluminum or alumina.

The supply pipe 12 or the exhaust pipe 16 having at least an inside wall surface formed of a material which is not etched by the cleaning gas 4 may be employed in any one of the first to eighth embodiments. Similarly, the exhaust pipe 16 having the inside wall surface coated with the protection film described above may be employed in any one of the first to eighth embodiments.

For the fifth to seventh embodiments, the cleaning method described in the eighth embodiment may be selected.

While the cleaning is repeated within a predetermined cleaning time period in the second and fourth embodiments, for example, the cleaning may be repeated over a predetermined cleaning time period while the semiconductor is not manufactured.

As described above, according to embodiments described herein, it is possible to provide a method of cleaning a semiconductor manufacturing apparatus, a semiconductor manufacturing apparatus, and a management system capable of reducing the amount of using the cleaning gas for removing the deposition film deposited onto the inside wall of the treatment chamber.

While certain embodiments have been described, these embodiments have been presented by way of example only, and are not intended to limit the scope of the inventions. Indeed, the novel methods, apparatuses and systems described herein may be embodied in a variety of other forms; furthermore, various omissions, substitutions and changes in the form of the methods, apparatuses and systems described herein may be made without departing from the spirit of the inventions. The accompanying claims and their equivalents are intended to cover such forms or modifications as would fall within the scope and spirit of the inventions.

The invention claimed is:

1. A method of cleaning a semiconductor manufacturing apparatus, the method comprising:
   simultaneously supplying a cleaning gas for removing a deposition film deposited on an inside wall of a treatment chamber and an inert gas through a supply pipe of the treatment chamber so that a supply amount of the cleaning gas from the supply pipe per unit time is greater than an exhaust amount of the cleaning gas from n exhaust pipe of the treatment chamber per unit time; and
   supplying the inert gas while stopping the supply of the cleaning gas to increase a pressure in the treatment chamber and to fill the supply pipe with the inert gas after the cleaning gas and the inert gas are simultaneously supplied.

2. The method of claim 1, further comprising:
   vacuumizing the treatment chamber by exhausting the cleaning gas and the inert gas through the exhaust pipe.

3. The method of claim 2, wherein the simultaneous supplying of the cleaning gas and the inert gas through the supply pipe, the increasing of the pressure in the treatment chamber and the filling of the supply pipe with the inert gas, and the vacuumizing of the treatment chamber are repeated a plurality of times depending on a thickness of the deposition film within a predetermined cleaning time period.

4. The method of claim 2, wherein the simultaneous supplying of the cleaning gas and the inert gas through the supply pipe is performed by supplying the cleaning gas into the treatment chamber in a state that an exhaust valve of the exhaust pipe is closed, or by supplying the cleaning gas into the treatment chamber in a state that the exhaust valve is opened and closing the exhaust valve after the cleaning gas is supplied, the increasing of the pressure in the treatment chamber and the filling of the supply pipe with the inert gas are performed in a state that the exhaust valve is closed, and the vacuumizing of the treatment chamber is performed in a state that he exhaust valve is opened.

5. The method of claim 1, wherein the inert gas is supplied to fill the supply pipe and the exhaust pipe with the inert gas.

6. The method of claim 1, wherein a surface of an inside wall of the supply pipe is formed of a material which is not etched by the cleaning gas.

7. The method of claim 1, wherein an inside wall of the exhaust pipe is coated with a protection film capable of being etched by the cleaning gas.

8. The method of claim 1, wherein the cleaning gas contains at least a halogen gas.

9. The method of claim 1, wherein the inert gas is a helium (He) gas, a neon (Ne) gas, an argon (Ar) gas, a nitrogen ($N_2$) gas, or clean dry air (CDA).

10. The method of claim 1, wherein the treatment chamber comprises an outer pipe, and an inner pipe provided in the outer pipe.

11. The method of claim 10, wherein the inner pipe comprises the supply pipe, and a supply valve of the supply pipe; and the outer pipe comprises the exhaust pipe, and an exhaust valve of the exhaust pipe.

12. The method of claim 10, wherein the simultaneous supplying of the cleaning gas and the inert gas through the supply pipe, and the increasing of the pressure in the treatment chamber and the filling of the supply pipe with the inert gas are repeated a plurality of times depending on a thickness of the deposition film within a predetermined cleaning time period, and the treatment chamber is vacuumized after the simultaneous supplying of the cleaning gas and the inert gas through the supply pipe, the increasing of the pressure in the treatment chamber, and the filling of the supply pipe with the cleaning gas are repeated the plurality of times.

* * * * *